US010394263B2

(12) United States Patent
Enjalbert et al.

(10) Patent No.: US 10,394,263 B2
(45) Date of Patent: Aug. 27, 2019

(54) ULTRA LOW POWER LINEAR VOLTAGE REGULATOR

(71) Applicant: NXP USA, Inc., Austin, TX (US)

(72) Inventors: Jerome Romain Enjalbert, Tournefeuille (FR); Marianne Maleyran, Saubens (FR); Philippe Bernard Roland Lance, Toulouse (FR); Jalal Ouaddah, Labastidette (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/009,109

(22) Filed: Jun. 14, 2018

(65) Prior Publication Data

US 2019/0033902 A1 Jan. 31, 2019

(30) Foreign Application Priority Data

Jul. 28, 2017 (EP) .................................... 17306018

(51) Int. Cl.
*G05F 1/575* (2006.01)
*G05F 1/56* (2006.01)
*H03K 17/22* (2006.01)

(52) U.S. Cl.
CPC ................ *G05F 1/575* (2013.01); *G05F 1/56* (2013.01); *H03K 17/22* (2013.01)

(58) Field of Classification Search
CPC . G05F 1/56; G05F 1/562; G05F 1/565; G05F 1/575; G05F 1/465
See application file for complete search history.

(56) References Cited

U.S. PATENT DOCUMENTS

| | | | |
|---|---|---|---|
| 6,177,785 B1 | 1/2001 | Lee | |
| 7,274,203 B2 | 9/2007 | Tumin et al. | |
| 7,880,452 B1 | 2/2011 | Prasad et al. | |
| 8,253,396 B2 | 8/2012 | Tanzawa | |
| 8,502,519 B2 | 8/2013 | Riedel | |
| 2005/0134242 A1 | 6/2005 | Gradinariu | |
| 2014/0103890 A1 | 4/2014 | Naidu et al. | |
| 2015/0052622 A1 * | 2/2015 | Cabler | G09C 1/00 726/34 |
| 2016/0103458 A1 | 4/2016 | Shukla et al. | |

FOREIGN PATENT DOCUMENTS

WO WO 2014/177901 A1 11/2014

OTHER PUBLICATIONS

Kim, Yongtae et al; "An Ultra-low Voltage Digitally Controlled Low-Dropout Regulator with Digital Background Calibration"; IEEE 13th International Symposium on Quality Electronic Design; pp. 151-158 (Mar. 19, 2012).

* cited by examiner

*Primary Examiner* — Gary L Laxton
(74) *Attorney, Agent, or Firm* — Charlene R. Jacobsen

(57) ABSTRACT

A method for voltage regulation includes reducing a power consumption of a voltage regulator during an IDLE phase, by disabling a feedback loop configured to regulate an internal voltage to a multiple of a reference voltage in response to the voltage regulator receiving a digital signal from a digital circuit. The internal voltage is proportional to an external voltage supplied to the digital circuit. A regulated accuracy of the external voltage is increased during a MEASUREMENT phase by enabling the feedback loop in response to the voltage regulator receiving the digital signal from the digital circuit.

19 Claims, 7 Drawing Sheets

START-UP Phase

IDLE Phase

MEASUREMENT Phase

ULTRA LOW POWER LINEAR VOLTAGE REGULATOR

CROSS-REFERENCE TO RELATED APPLICATIONS

This application claims the priority under 35 U.S.C. § 119 of European patent application no. 17306018.7, filed Jul. 28, 2017 the contents of which are incorporated by reference herein.

FIELD

This disclosure relates generally to linear voltage regulation, and more specifically to voltage regulation requiring ultra low quiescent power consumption.

BACKGROUND

Consumer sensing applications are often required to perform highly accurate measurements for a relatively short period of time relative to the total time the sensor is activated. High accuracy measurements are often achieved with analog circuitry having large bias currents that will dominate quiescent current consumption between MEASUREMENT phases. Consumer sensors with digital outputs offer a programmable data rate to provide the best trade-off between performance, (e.g. noise in particular) and current consumption.

A common use case includes configuring an accelerometer to operate at a low data rate to monitor motion in the application, with very low power consumption. When motion is detected, the microcontroller changes the configuration of the sensor to operate at a higher data rate to get a series of high accuracy, low noise measurements of the acceleration.

To offer a wide range of Output Data Rates (ODRs), consumer accelerometers employ pulsed operation. For example, low-noise signal acquisition and conversion is performed during a MEASUREMENT phase with relatively high current consumption (IDD). The MEASUREMENT phase has a fixed duration and repeats at a frequency equal to the ODR. Between two consecutive MEASUREMENT phases is an IDLE phase with the duration dependent on the ODR. The current consumption during the IDLE phase is reduced to the minimum to operate as a voltage regulator to supply power to the digital block of the accelerometer and to keep a user-programmed register content and a low-frequency oscillator operational to control the length of this IDLE phase.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
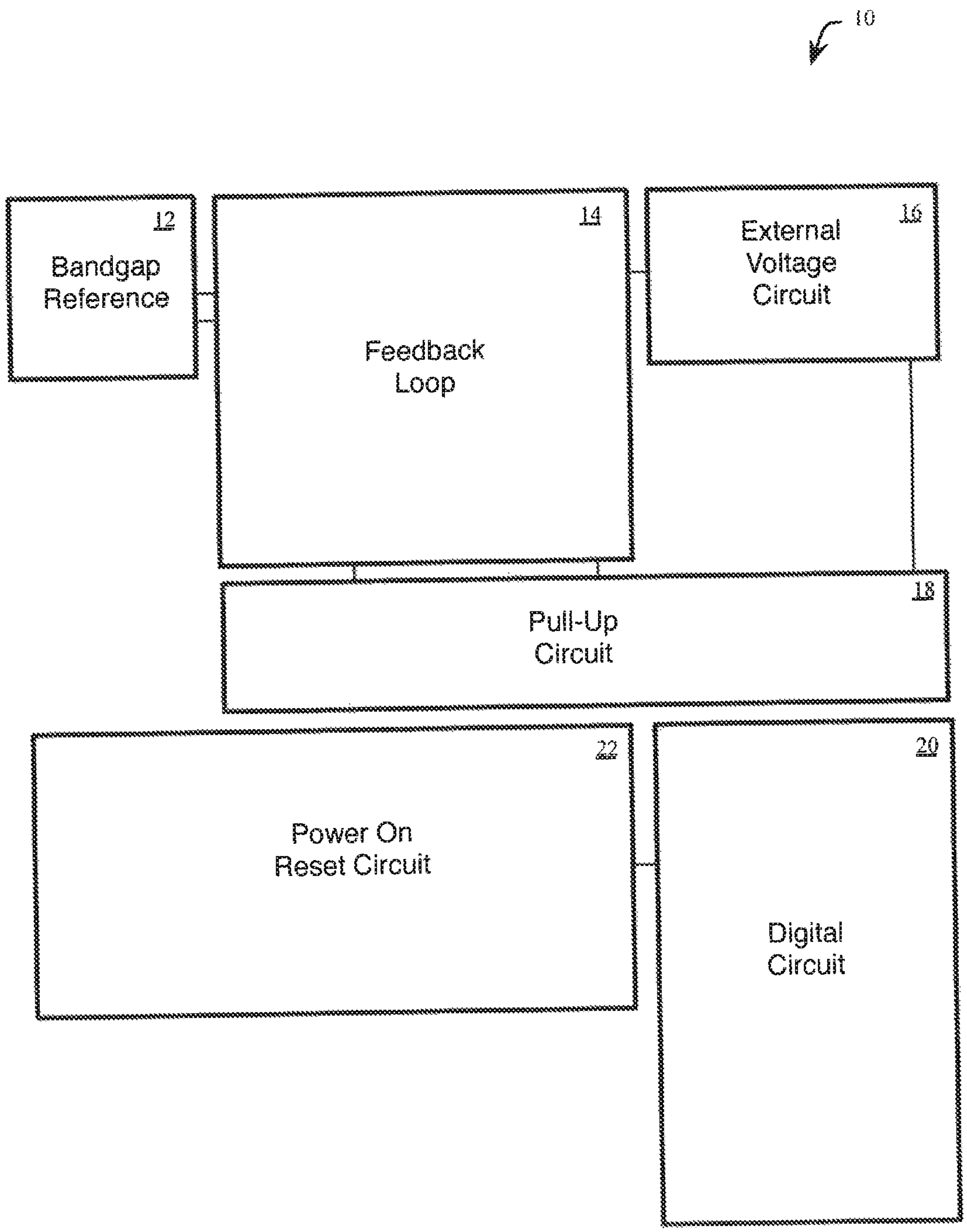
FIG. 1 is a functional block diagram of a system for ultra low power linear voltage regulation in accordance with an embodiment of the present disclosure.

Embodiments of systems and methods described herein provide for ultra low power voltage regulation by deactivating direct current (DC) paths and analog circuitry of a linear voltage regulator during an IDLE phase. The IDLE phase is defined as the time between MEASUREMENT phases, wherein higher current consumption is necessitated for improved measurement results. In one example, during the MEASUREMENT phase, current consumption increases relative to the IDLE phase by activating resistive strings and current biased amplifiers. In this example, during the IDLE phase a digital circuit is kept active to retain user-programmed content and a low-frequency oscillator controls the duration of the IDLE phase. The embodiments are further extended to ensure low voltage dropout operation with active pull-up devices.

Paradoxically, the linear voltage regulator, including the power consuming DC paths and amplifiers, supplies power to the digital circuitry, and the digital circuitry provides control signals to the linear voltage regulator to assist with the transition between the IDLE and MEASUREMENT phases through preservation of states and an efficient Power On Reset (POR). By allowing for interdependency between the linear voltage regulator and the digital circuitry and providing innovative solutions to starting-up the system of digital and analog circuitry and transitioning between the IDLE and MEASUREMENT phases, exceptionally low quiescent power and total power consumption is realized.

At very low Output Data Rates (ODRs), for example as used for basic motion detection (e.g., 1 Hz) in a sensor system, the contribution of the MEASUREMENT phase to the total average current consumption (IDD) becomes negligible due to the low duty cycle. (defined as the MEASUREMENT phase divided by the total cycle time of MEASUREMENT plus IDLE phases). The ODR (and hence the duty cycle) is also limited by the rate of variation of the supply voltage during the IDLE phase. For example, VDD cannot be allowed to vary excessively during the IDLE phase, when an external voltage used by the digital circuits is unregulated and when the external voltage is clamped to VDD by pull-up circuits. As used herein, the term "external voltage" refers to a voltage that is outside of a regulated feedback loop of the power converter, but not necessarily outside of an Integrated Circuit (IC) that includes the power converter. The external voltage is derived from a regulated "internal voltage" by use of a common gate voltage as further described below. In one embodiment, a variation of VDD was found to be less than +/−200 mV in 25 ms, hence a duty cycle of 1/100 was practical. In example embodiments with low ODRs, test results have shown a reduction in total average current consumption from 1 uA down to 10 nA—a reduction of 100× compared to previous products. Similar results are envisioned for other product applications targeting ultra low power, including without limitation Internet of Things (IoT) and sensor based applications.

FIG. 1 shows the functional blocks of an embodiment of a system 10 including an ultra low power linear voltage regulator ("voltage regulator") and a digital circuit. The voltage regulator includes a bandgap reference 12, a feedback loop 14, an external voltage circuit 16 and a pull-up circuit 18. The bandgap reference 12 provides a temperature stabilized reference voltage to the feedback loop 14. The feedback loop 14 regulates an internal voltage to a multiple of the reference voltage by using an amplifier configured with negative feedback. The external voltage circuit 16 creates an external voltage to "mirror" or be substantially equal to the internal voltage. The pull-up circuit 18 ensures that the internal voltage and the external voltage will each be clamped to the supply voltage (VDD), when VDD drops to a level marginally above the reference voltage such that effective voltage regulation is no longer possible. In one example a difference between VDD and the reference voltage must exceed a gate-to-source voltage drop (Vgs) of an N-channel Field Effect Transistor (FET) or NFET for the feedback loop 14 to function properly.

The system 10 further includes a power on reset (POR) circuit 22 and a digital circuit 20. The POR circuit includes an imprecise POR that forces a reset of the digital circuit 20 when VDD is first applied and thereby also forces active-low enable signals from the digital circuit 20 to activate the bandgap reference 12, which in turn activates the feedback loop 14 to generate a stable internal voltage. A stable bandgap condition also activates a more precise POR, which keeps the digital circuit 20 in the reset state until the internal voltage is stable.

Figure 2:
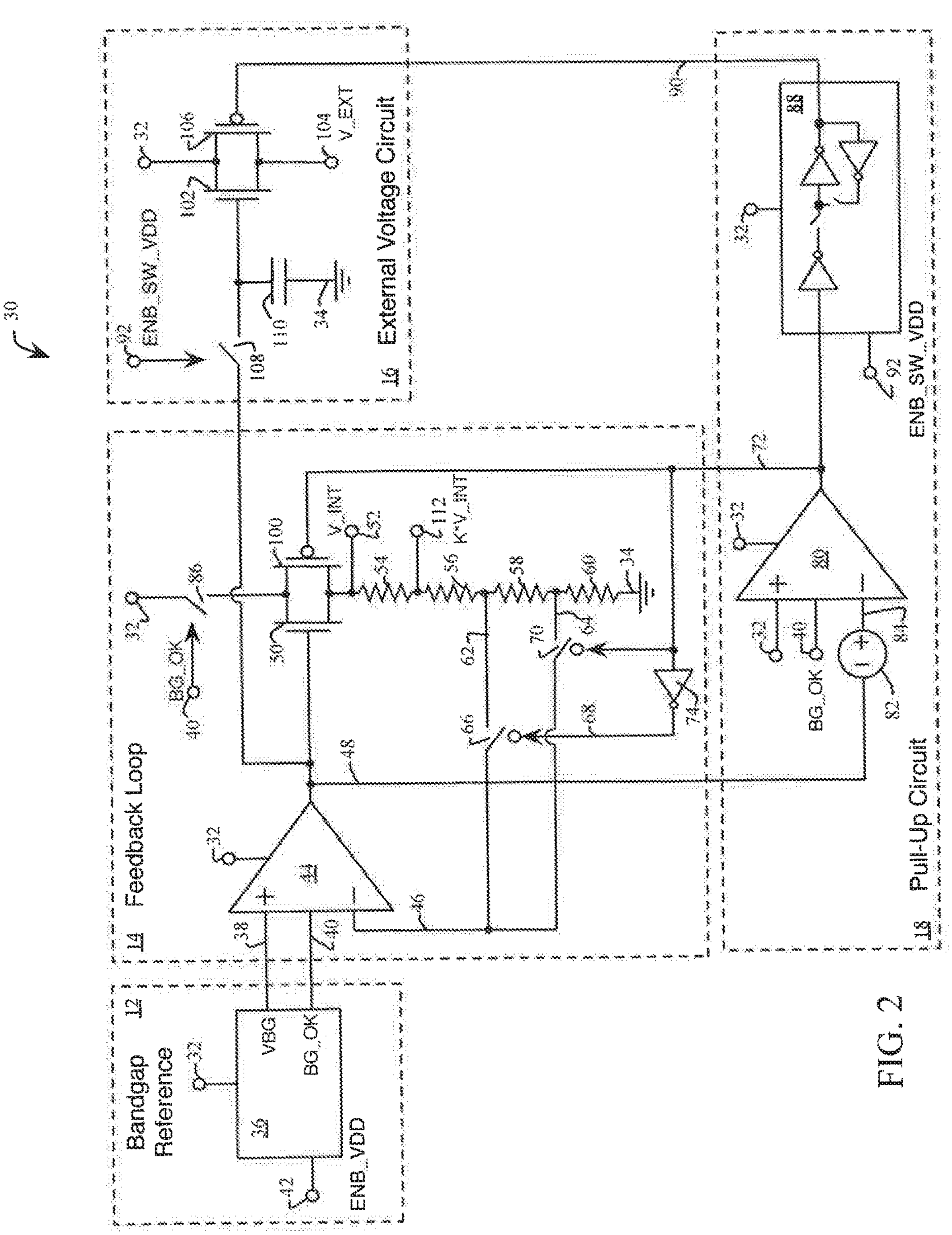
FIG. 2 is a schematic view of an embodiment of an ultra low power linear voltage regulator included in FIG. 1
Figure 3:
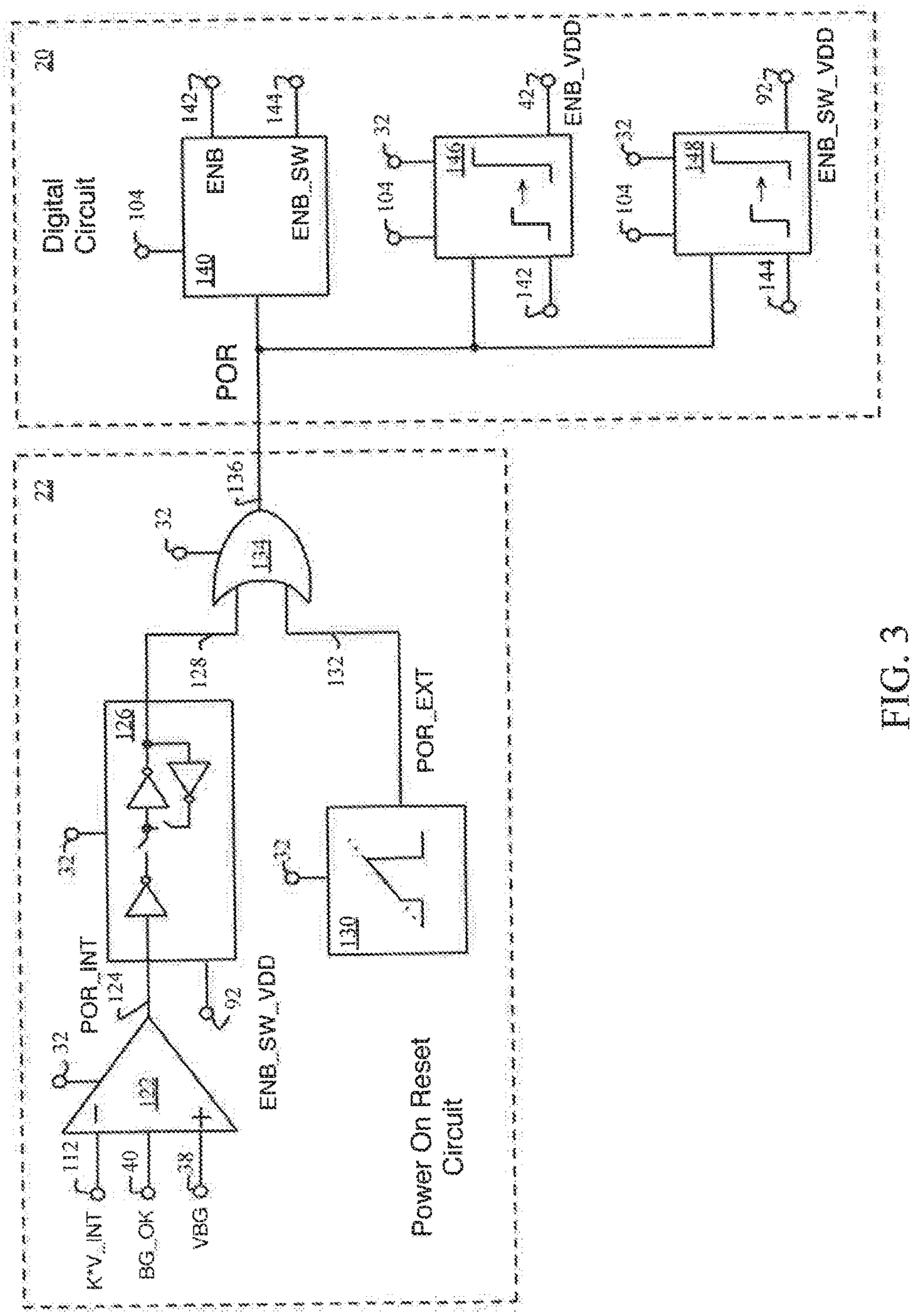
FIG. 3 is a schematic view of an embodiment of a Power On Reset (POR) circuit, and digital circuit included in FIG. 1.

Turning to FIG. 2 with on-going reference to FIG. 1, the voltage regulator is now described in further detail. In FIG. 2 and FIG. 3, various embodiments of the circuits that are supplied by VDD 32 and/or an external voltage 104 are referenced to VSS 34, however the connections to VSS 34 are not shown for clarity of exposition. An embodiment of a voltage regulator 30 includes a bandgap reference 12, a feedback loop 14, an external voltage circuit 16 and a pull-up circuit 18. The pull-up circuit 18 controls PFETs 100 and 106 in the feed-back loop 14 and external voltage circuit 16 respectively. The bandgap reference 12 receives power from the supply voltage (VDD) 32, which is further referenced to ground (VSS) 34. In one embodiment, the ground 34 is at zero volts, although in other embodiments other DC voltage references are used for ground 34. In one embodiment, the bandgap reference 12 includes a bandgap with a Current Proportional To Absolute Temperature (IPTAT) circuit 36. The bandgap with IPTAT circuit 36 (generally the bandgap reference 12) is enabled with an active-low ENB_VDD signal 42 to produce a reference voltage (VBG) 38. When the reference voltage is stable, the bandgap reference 12 activates a bandgap status signal (BG_OK) 40.

The feedback loop 14 includes an amplifier 44 powered by VDD 32. The amplifier 44 is enabled by the BG_OK 40 and compares the reference voltage 38 to a feedback signal 46 to produce a control voltage 48. In one embodiment, the amplifier 44 is an Operational Transconductance Amplifier (OTA). The control voltage 48 drives the gate of an internal voltage NFET 50 to generate an internal voltage 52. The NFET 50 is arranged as a source follower to generate the internal voltage 52 at the source of the NFET 50. The NFET 50 is connected in series with a resistor string, (e.g., resistive divider), formed by resistors 54, 56, 58 and 60, and ground 34. The resistor string provides a high tap 62 connected between resistors 56 and 58. The resistor string provides a low tap 64 connected between resistors 58 and 60. The high tap 62 and the low tap 64 are connected to the feedback signal 46 by a P-channel FET (PFET) switch 66 controlled by signal 68 and by a PFET switch 70 controlled by a pull-up signal 72 respectively. Inverting the pull-up signal 72 with an inverter 74 generates the signal 68. The high lap 62 and low tap 64 are designed to provide hysteresis to the amplifier 44 controlled by the pull-up signal 72. In another embodiment, the switches 66 and 70 are NFET switches, the pull-up signal 72 controls the switch 66 and the inverted signal 68 controls the switch 70.

The pull-up circuit 18 includes a pull-up comparator 80, powered by VDD 32, enabled by the BG_OK 40, and configured to compare VDD 32 with an offset control voltage 84. Adding an offset voltage 82 to the control voltage 48 generates the offset control voltage 84. In one non-limiting embodiment, the offset voltage 82 is a charged capacitive element (e.g., a battery or capacitor charged with switches). In one example, the offset voltage 82 is a few dozen mV. The pull-up signal 72 transitions low (e.g. active) when VDD 32 decreases to within an offset voltage (or less) of the control voltage 48. The control voltage 48 is equal to the internal voltage 52 plus the Vgs drop of the internal voltage NFET 50. When the pull-up signal 72 transitions low, the PFET switch 70 connects the low tap 64 to the feedback signal 46, thereby increasing the control voltage 48 to ensure a clean transition of the pull-up signal 72 without oscillations. Conversely, when the pull-up signal 72 transitions high, the PFET switch 66 connects the high tap 62 to the feedback signal 46 to lower the control voltage 48.

The bandgap reference 12 is disabled with the ENB_VDD 42 signal, which disables the BG_OK signal 40. The BG_OK signal subsequently disables the amplifier 44, the pull-up comparator 80 and the switch 86. The switch 86 disables the DC path flowing from VDD 32, through the internal voltage NFET 50, through the resistors 54, 56, 58, 60, and to the ground 34.

The pull-up circuit further includes a pull-up latch 88 powered by VDD 32. The pull-up latch 88 generates a latched pull-up signal 90 from the pull-up signal 72 in response to the active-low ENB_SW_VDD signal 92. Specifically, the pull-latch 88 allows the pull-up signal 72 to flow through the latch when the ENB_SW_VDD signal 92 is low ("0"), and latches the pull-up signal 72 when signal 92 is high ("1"). When the pull-up signal 72 is active due to an insufficient voltage (e.g., headroom) between VDD 32 and the control voltage 48, the pull-up signal 72 activates the internal voltage PFET 100, thus clamping the internal voltage 52 to VDD 32.

The external voltage circuit 16 includes an external voltage NFET 102 connected between VDD 32 and a generated external voltage 104. Similar to the internal voltage NFET 50, the external voltage NFET 102 is configured as a source follower. An external voltage PFET 106 is connected in parallel with the external voltage NFET 102 and is configured to clamp the external voltage 104 to VDD 32 in response to the latched pull-up signal 90 being active (e.g., low or "0"). The latched pull-up signal 90 will activate the external voltage PFET when low regardless of whether the pull-up latch is open (e.g., in flow-through mode) or closed (e.g. latched). The ENB_SW_VDD signal 92 also activates a switch 108 to store the control voltage 48 on a storage capacitor 110 connected to ground 34. Specifically, when the ENB_SW_VDD signal 92 is low ("0"), the control voltage 48 is connected directly to the gate of the external voltage NFET 102. When the ENB_SW_VDD signal 92 is high ("1"), the switch 108 is opened and the gate voltage for the external voltage NFET 102 is held on the storage capacitor 110.

In various embodiments, the system 10 of FIG. 1 is implemented in an MOS technology including without limitation. CMOS, DMOS or BICMOS. Regardless of the chosen technology, it is important for the external voltage NFET to be implemented in an MOS technology to reduce leakage on the storage capacitor 110. The voltage regulator 30 is very stable because the feedback loop 14, which generates the internal voltage 52 has a relatively small and constant capacitive load. In various embodiments, the current densities of the internal voltage NFET 50 and the external voltage NFET 102 are matched to ensure good matching between the internal voltage 52 and the external voltage 104. In embodiments where the current densities have a small amount of mismatch, differences between the internal voltage 52 and the external voltage 104 are small because the internal voltage NFET 50 and the external voltage NFET 102 operate in weak inversion. It should be noted that the external voltage circuit 16 is external to the feedback loop 14, but may or may not be external to the Integrated Circuit (IC) that contains the feedback loop 14. Furthermore, certain embodiments include more than one external voltage circuit 16 with either a corresponding pull-up circuit 18 or a shared connection to the latched pull-up signal 90. In various embodiments, the feedback loop 14 also includes a scaled internal voltage 112 as shown in FIG. 2 between resistors 54 and 56. It should be understood that the embodiment of FIG. 2 is not limited to the four resistors 54, 56, 58 and 60, as different numbers of resistors are realizable to implement the hysteresis for the amplifier 44 and to provide for the scaled voltage 112.

FIG. 3, with continued reference to FIG. 1 and FIG. 2, describes an embodiment 120 of a POR circuit 22 and a digital circuit 20. The POR 22 includes a POR comparator 122, powered by VDD 32 and enabled by BG_OK 40. The POR comparator 122 is configured to compare the scaled voltage 112 with the reference voltage 38 to generate an internal POR (POR_INT) signal 124. The ratio of the scaled voltage 112 to the internal voltage 52 is designed to ensure that POR_INT is activated in the presence of manufacturing and environmental (e.g., voltage and temperature) variations. For example, due to standard manufacturing and environmental variations, the regulated internal voltage 52, which is regulated to a multiple of the reference voltage 38, may vary.

The POR_INT 124 is latched by a POR latch 126 to generate a latched POR_INT 128, in response to the ENB_SW_VDD signal 92 transitioning high ("I"). Similarly, the latched POR_INT 128 tracks the POR_INT signal 124 when the latch 126 is open, in response to the ENB_SW_VDD signal 92 transitioning low ("0"). The POR latch 126 is powered by VDD 32. The POR circuit 22 further includes an imprecise POR 130 powered by VDD 32. The imprecise POR 130 generates an external POR (POR_EXT) signal 132 proportional to a value of VDD 32 while VDD 32 is ramped up to a start-up threshold. The start-up threshold is sufficient to ensure that the bandgap reference 12 starts up and has a stable BG_OK 40 with the available VDD 32 voltage. The latched POR-INT 128 and the POR_EXT signal 132 are combined with a Boolean OR gate 134 to generate a POR signal 136. The OR gate 134 is powered by VDD 32.

An embodiment of the digital circuit 20 includes a controller 140, powered by the external voltage 104 from the voltage regulator, and is configured to generate timing signals to control the voltage regulator. It should be understood that in various embodiments, the digital circuit 20 contains more than just the circuitry required to control the voltage regulator. For example, the digital circuit may contain logic functions such as a Serial Port Interface (SPI). I2C communication functions, state machines, and various algorithmic circuits. In some embodiments, the digital circuit includes 10,000 or more logic gates or up to multiple millions of gates. Specifically, the controller 140 generates at least an active-enable signal (ENB) 142 and an active-low enable switch signal (ENB_SW) 144, both of which transition between a ground 34 voltage and the external voltage 104. The controller 140 is connected to the POR 136 signal for resetting the controller 140. In one embodiment, the digital circuit also includes an ENB level shifter 146, and an ENB_SW level shifter 148. In another embodiment, the ENB level shifter 146 and the ENB_SW level shifter 148 are separate circuits from the digital circuit 20 with similar connections as shown in FIG. 3.

The ENB level shifter 146 is powered by both the external voltage 104 and VDD 32 and is reset with the POR signal 136. The ENB level shifter 146 shifts the ENB signal 142 to generate the ENB_VDD signal 42, which transitions between a ground 34 voltage and VDD 32. The ENB_SW level shifter 148 is powered by both the external voltage 104 and VDD 32 and is reset with the POR signal 136. The ENB_SW level shifter 148 shifts the ENB_SW signal 144 to generate the ENB_SW_VDD signal 92, which transitions between ground 34 voltage and VDD 32.

The external (e.g. imprecise) POR signal 132 is generated from VDD 32 and hence ensures that the enable signal ENB_VDD 42 for the bandgap reference 12 of the voltage regulator is correctly asserted on start-up, when input voltage VDD ramps from ground potential (e.g., 0 Volts) and the external voltage 104 is also at ground potential. The level-shifters are configured to output a logic LOW value when the POR input 136 is HIGH. When VDD 32 is ramping but still too low for the analog blocks and/or the latches to operate correctly, the external POR 132 forces the POR input of the level-shifters to be HIGH, which results in the control signals ENB_VDD and ENB_SW_VDD being correctly asserted LOW for a safe start-up of the analog blocks. The POR circuit 22 also features a second Power-On-Reset signal POR_INT 124 generated from a scaled internally regulated voltage K*V_INT 112. This second POR needs to be precise and accurate for the following reasons.

In various embodiments, the boot sequence of the system 10 involves loading the contents of an embedded memory (e.g., a One Time Programmable memory) into registers to be used by the digital circuit 20 (or conversely, are part of the digital circuit). This boot sequence must be performed under a minimum value of the external voltage 104 supply, which powers the digital circuit 20 and also the embedded memory (not shown). Accordingly, the POR 136 must hold the digital circuit 20 in the reset state until the minimum value of the external voltage 104 is reached by the voltage regulator, to be able to reliably read the contents of the embedded memory.

Conversely, the nominal value of the external voltage 104 is just a bit lower than the minimum value of VDD 32 (e.g., 100 mV lower in one example). Consequently, the detection window to generate POR_INT 124 is very narrow. On the one hand, if the POR 136 release voltage is set too low, the memory contents may not be read correctly. On the other hand, if the POR 136 release voltage is set too high, it may never be released in the case where VDD 32 is at its minimum value. To meet such accuracy constraints, the POR comparator 122 detects when the voltage at K*V_INT 112 crosses the reference voltage 38. Comparing a tap of the resistor divider of the feedback loop to the bandgap reference produces a precise POR threshold at minimum current consumption.

During the IDLE phase, if an unexpected event results in a significant drop in the VDD 32 level, (such as a glitch or line brown-out), the internal POR 124 activates to reset the system 10. This is needed because the latched POR_INT signal 128 depends upon the state of the latch 126, which will become indeterminate due to the unknown state of the ENB_SW_VDD signal 92 when there is an under-voltage event on VDD 32. In response to the under-voltage event, the external POR 132 forces the level shifters into a known state, which in turn resets the bandgap reference 12, which activates and stabilizes the feedback loop 14, and thereby generates the precise POR_INT 124 signal.

Figure 4:
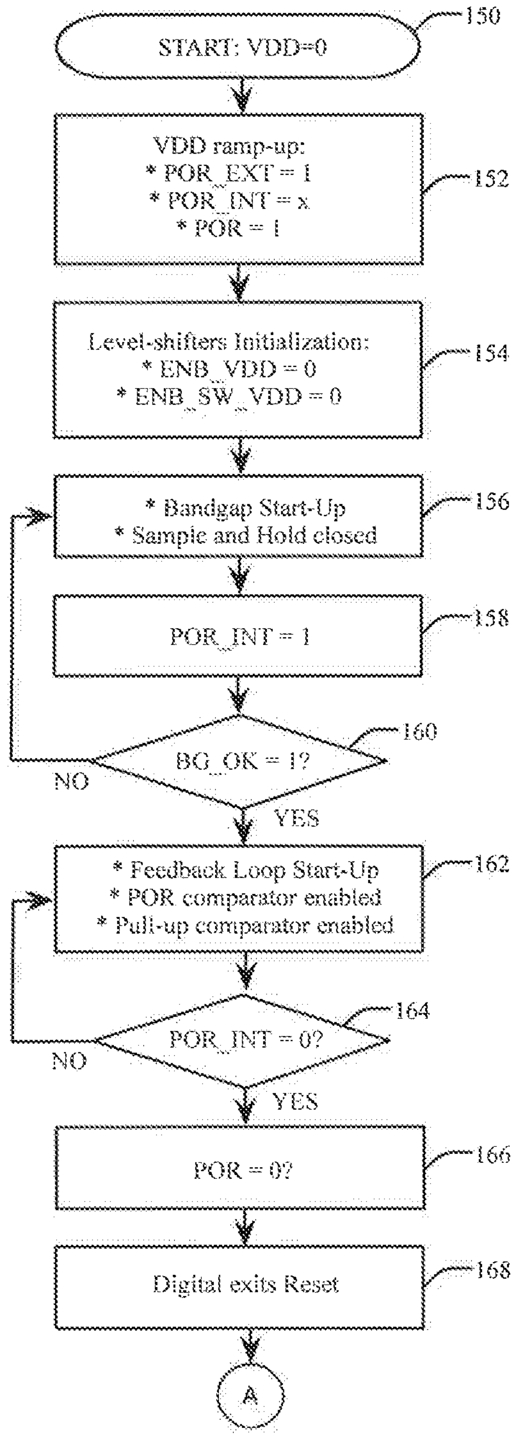
FIG. 4 is a flowchart representation of a method for a START-UP phase of an ultra low power linear voltage regulator.
Figure 5:
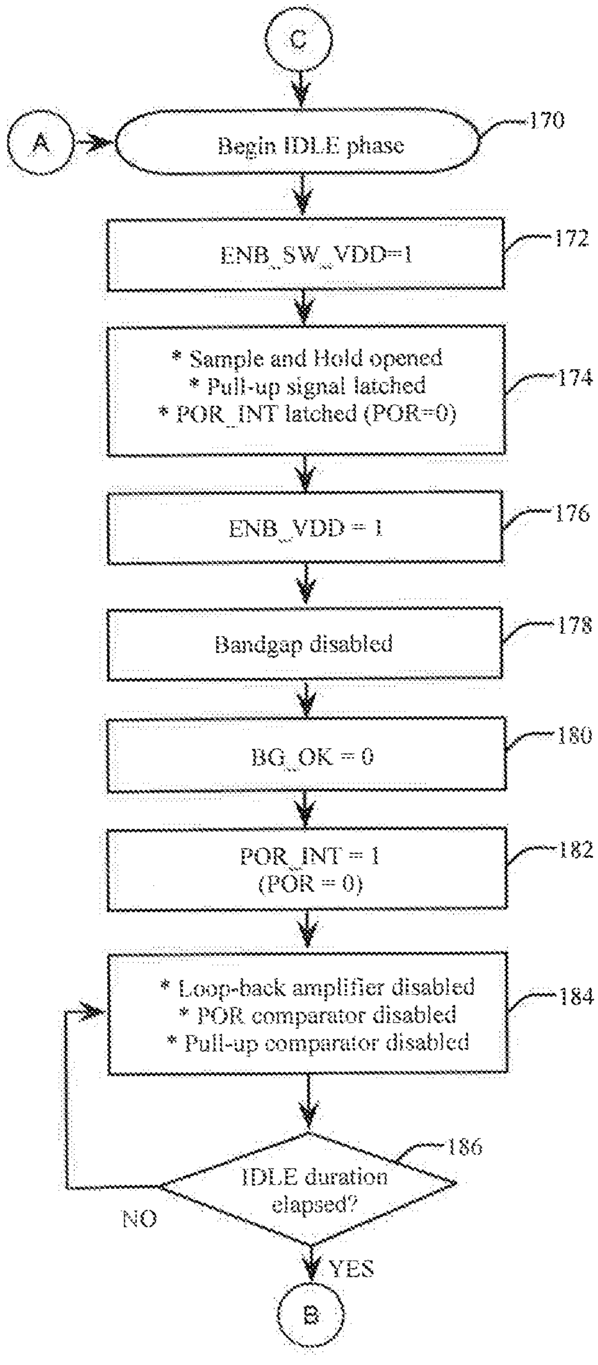
FIG. 5 is a flowchart representation of a method for an IDLE phase of an ultra low power linear voltage regulator.
Figure 6:
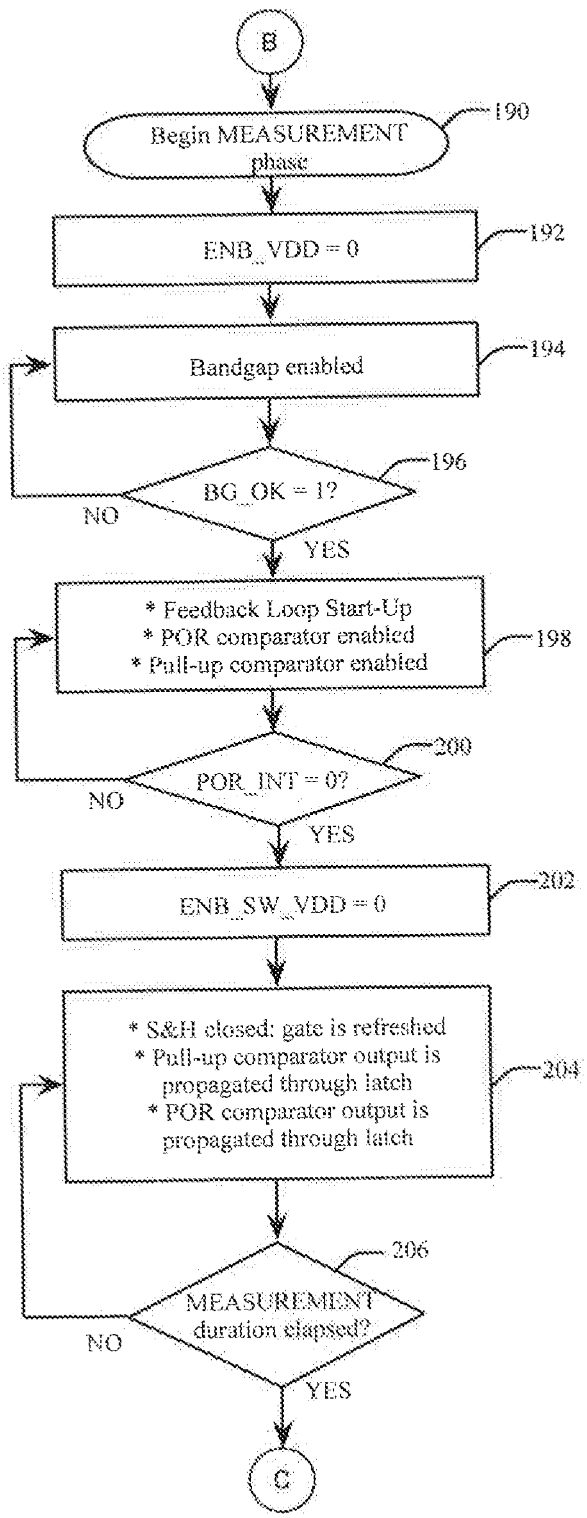
FIG. 6 is a flowchart representation of a method for a MEASUREMENT phase of an ultra low power linear voltage regulator.

The operation sequence for the START-UP, MEASUREMENT and IDLE phases of the system 10 are shown in FIG. 4 to FIG. 6. Referring to FIG. 4, with continued reference to FIG. 2 and FIG. 3, the START-UP phase begins at 150 with VDD 32 at 0 Volts. At 152, the VDD voltage 32 ramps up from 0V towards an intended operating voltage. The POR_EXT is asserted (POR_EXT=1), with a voltage proportional to VDD 32. The POR_INT 124 signal remains indeterminate because the BG-OK signal 40 is indeterminate due to the low value of VDD 32. When VDD 32 is high enough for BG-OK 40 to be correctly asserted by the bandgap reference 12, the POR_INT signal 124, (and hence the latched POR_INT 128), will transition high. The POR signal 136 is active ("1") because the latched POR_INT 128 and POR_EXT 132 are combined with the OR gate 134. At 154, the POR signal 136 initializes (e.g. resets) the ENB level shifter 146 to generate the active-low ENB_VDD signal 42 at 0V, and the ENB_SW level shifter 148 to generate the active-low ENB_SW_VDD signal 92 at 0V.

At 156, the bandgap is started because the active-low ENB_VDD signal 42 is applied to the bandgap reference 12. At 156, the sample and hold is closed by activating switch 108 with the ENB_SW_VDD signal 92, thereby connecting the control voltage 48 directly to the gate of the external voltage NFET 102. At 158 the internal POR 124 is high ("1") because the POR comparator 122 is disabled (e.g., BG_OK is low). At 160, if the bandgap reference 12 has not stabilized, as indicated by BG_OK 40 being high ("1"), then the flow returns to 156. Otherwise at 162, when BG_OK is high, the BG_OK signal 40 enables the amplifier 44 and the resistor string via the switch 86. The POR comparator 122 and the pull-up comparator 80 are also enabled by the BG_OK signal 40. At 164, if the interval voltage 52, and thus the scaled internal voltage K*V_INT 112, is stable and at the regulated voltage, then K*V_INT 112 will be at a higher voltage than VBG 38 and the POR comparator 122 will transition low (e.g., POR_INT=0). Otherwise the flow returns to 162. At 166, the POR 136 will transition low ("0") and thus at 168 the digital circuit 20, including the controller 140, ENB level shifter 146 and ENB_SW level shifter 148 will exit the rest mode.

The POR_EXT 132 remains asserted until it reaches a predetermined "start-up threshold" designed to be sufficient for a correct operation of the bandgap reference 12. The POR remains asserted until the feedback loop 14 is stable because the POR_INT 124 activates before the POR_EXT 132 deactivates. Thus, the POR signal 136 transitions from the imprecise POR_EXT 132 to the relatively precise POR_INT 124. During startup, the active-low ENB_SW_VDD signal 92 is low, hence the latched POR_INT 128 is equivalent to the POR_INT 124. After 168, the flow continues to 170 on FIG. 5.

Referring to FIG. 5, with continued reference to FIG. 2. FIG. 3 and FIG. 4, the IDLE phase begins at 170. At 172, the active-low ENB_SW_VDD signal 92 is deactivated ("1"). Consequently at 174, the sample-and-hold is opened, by opening the switch 108 with the ENB_SW_VDD signal 92, and thereby stores the control voltage 48 on the storage capacitor 110. The pull-up signal 72 is latched by the pull-up latch 88 to generate the latched pull-up signal 90. The POR_INT signal 124 is latched by the POR latch 126 to generate the latched POR-INT signal 128. Consequently, the external voltage 104 continues to power the digital circuit 20 however without a closed loop regulation. The last state of the pull-up signal 72 is maintained and the latched POR_INT 128 is held low ("0").

At 176, the ENB_VDD signal 42 is deactivated ("1"), which disables the bandgap reference 12 at 178. Disabling the bandgap reference 12 results in the BG_OK signal 40 transitioning low, or false ("0") at 180. At 182, the POR_INT 124 switches high ("1") because the POR comparator 122 is deactivated by the BG_OK signal 40 being low. The POR signal 136 remains low because the POR latch 126 held the last state of the POR_INT signal 124 before deactivating the POR comparator 122. At 184, the loopback amplifier 122, the POR comparator 122 and the pull-up comparator 80 are disabled in response to the BG_OK 40 being low. At 186, if the IDLE duration has elapsed, then the flow proceeds to 190 on FIG. 6. Otherwise, the flow returns to 184. The IDLE duration is determined in part due to the leakage on the storage capacitor 110 and gate of the external voltage NFET 102, and the variation of VDD 32 during this unregulated period.

Referring to FIG. 6, with continued reference to FIG. 2, FIG. 3 and FIG. 5, the MEASUREMENT phase begins at 190. At 192, the ENB_VDD signal 42 is activated ("0"), which enables the bandgap reference 12 at 194. At 196, if the bandgap is stable as indicated by BG_OK 40 being high, then the flow proceeds to 198, otherwise the flow returns to 194. At 198, the feedback loop is enabled by enabling the amplifier 44, and the resistor string via the switch 86. The POR comparator 122, and the pull-up comparator 80 are also enabled by the BG_OK signal 40. In another embodiment, a combination of one or more of the amplifier 44, the resistor string via the switch 86, the POR comparator 122, and the pull-up comparator 80 are enabled at 198, and correspondingly disabled at 184 of FIG. 5.

At 200, if the POR_INT signal 124 is low ("0") as a result of the internal voltage 52 stabilizing (e.g., reaching a final regulated voltage similar to a multiple of the reference voltage 38), and consequently the scaled internal voltage 112 is stable, then the flow proceeds to 202, otherwise to 198. At 202, the active-low ENB_SW_VDD signal 92 is activated ("0"). At 204, the sample-and-hold is closed by closing the switch 108 and thereby "refreshing" the gate voltage on the external voltage NFET 102 by connecting the gate of the NFET 102 directly to the control voltage 48. The POR latch 126 is opened to allow the POR_INT 124 to flow through the latch 126. Similarly, the pull-up latch 88 is opened to allow the pull-up signal 72 to flow through the latch 88. At 206, if the MEASUREMENT duration has elapsed, the flow returns to 170 of FIG. 5 to enter the IDLE phase. Otherwise the flow returns to 204.

Figure 7:
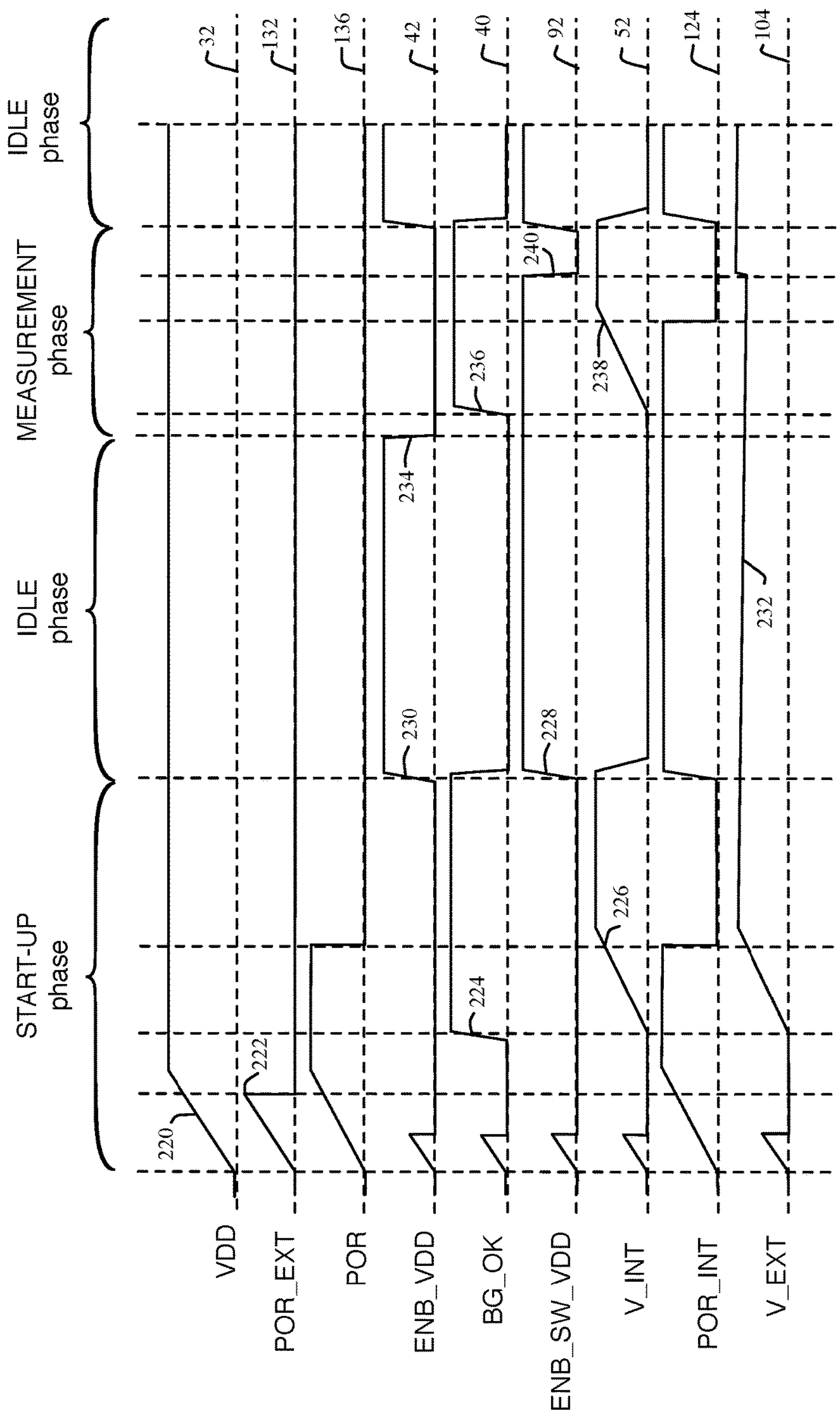
FIG. 7 is a graphical view of a tinting diagram for an embodiment of an ultra low power linear voltage regulator.

FIG. 7 is a graphical view of the timing for the START-UP. MEASUREMENT and IDLE phases as shown in FIG. 4, FIG. 5 and FIG. 6 respectively. The START-UP phase begins with VDD 32 at 0V and ramping to a final value as shown at 220. The POR_EXT 132 ramps in proportion to VDD 32 up to the start-up threshold shown at 222. The POR 136 activates the active-low ENB_VDD 42, which activates the bandgap reference 12. Once the bandgap reference 12 produces a stable reference voltage 38, the BG_OK 40 is activated as shown at 224. The activated BG_OK 40 enables the feedback loop 14, which ultimately produces a stable internal voltage 52, shown at 226. This stable voltage at 226 deactivates the internal POR 124. The analog state of the external voltage NFET 102, the digital state of the pull-up signal 72 and the digital state of the internal POR 124 are stored (by sampling and latching) by the ENB_SW_VDD signal 92 shown at 228. Entering the IDLE phase and powering down devices is accomplished by deactivating the ENB_VDD 42 shown as 230.

During the IDLE phase the digital circuit 20 continues to be powered by the external voltage 104 in an unregulated manner. As such, the V_EXT 104 slowly degrades over time as shown at 232. The MEASUREMENT phase is entered by activating the active-low ENB_VDD 42 as shown at 234. Similar to the START-UP phase, the ENB_VDD 42 activates the bandgap reference 12 to produce a stable reference voltage 38 as indicated by BG_OK 40 shown at 236. The activated bandgap reference 12 activates the feedback loop 14 and ultimately produces a stable internal voltage 52 shown at 238, which then disables the POR_INT 124. Once the voltage regulator has stabilized between 234 and 240, the preserved analog and digital states required to maintain the V_EXT 104 during the IDLE phase are refreshed, shown at 240. Specifically, the gate of the external voltage NFET, the POR states and the pull-up states are refreshed.

Advantageously, the teachings of the disclosure provide for a linear voltage regulator with ultra low power consumption. The interdependency between the analog voltage regulator and the digital circuit is efficiently managed, while enabling the deactivation of one or more circuits and paths that consume the majority of the quiescent current between MEASUREMENT phases. Numerous applications will benefit from the ability to minimize power consumption without compromising measurement accuracy, speed and other ensuing benefits.

As will be appreciated, embodiments as disclosed include at least the following. In one embodiment, a method for voltage regulation comprises reducing a power consumption of a voltage regulator during an IDLE phase, by disabling a feedback loop configured to regulate an internal voltage to a multiple of a reference voltage in response to the voltage regulator receiving a digital signal from a digital circuit. The internal voltage is proportional to an external voltage supplied to the digital circuit. A regulated accuracy of the external voltage is increased during a MEASUREMENT phase by enabling the feedback loop in response to the voltage regulator receiving the digital signal from the digital circuit.

Alternative embodiments of the method for voltage regulation include one of the following features, or any combination thereof. The IDLE phase comprises storing a gate voltage on a gate of a transistor, the transistor supplying the external voltage to the digital circuit, the external voltage being less than a supply voltage, latching a first state of a pull-up transistor, the pull-up transistor changing the external voltage to the supply voltage in response to a difference between the supply voltage and the gate voltage being less than an offset voltage, latching a second state of an internal Power On Reset (POR) signal, the internal POR signal holding the digital circuit in a reset state while the internal voltage is less than the reference voltage, disabling a bandgap reference configured to provide the reference voltage, and disabling the feed-back loop in response to disabling the bandgap reference. A pull-up comparator and a POR comparator are disabled in response to disabling the bandgap reference, the pull-up comparator comparing the supply voltage to the gate voltage increased by the offset voltage, and the POR comparator comparing the internal voltage to the reference voltage. The digital circuit is reset with an external POR in response to the supply voltage dropping below a start-up threshold. The digital circuit determines an IDLE duration of the IDLE phase and a MEASUREMENT duration of the MEASUREMENT phase, the voltage regulator entering the MEASUREMENT phase at the end of the IDLE duration, and the voltage regulator entering the IDLE phase at the end of the MEASUREMENT duration. The MEASUREMENT phase comprises enabling a bandgap reference configured to provide the reference voltage, stabilizing the feedback loop by ramping the internal voltage in response to enabling the bandgap reference, and disabling an internal Power On Reset (POR) signal in response to the internal voltage exceeding the reference voltage, and refreshing a gate voltage of a transistor supplying the external voltage to the digital circuit, by connecting a gate of the transistor to the feedback loop, after a time delay following the disabling of the internal POR signal, the time delay sufficient for the feedback loop to stabilize. The MEASUREMENT phase further comprises updating a first state of a pull-up transistor, the pull-up transistor changing the external voltage to the supply voltage in response to a difference between the supply voltage and the gate voltage being less than an offset voltage, and updating a second state of an internal Power On Reset (POR) signal, the internal POR holding the digital circuit in a reset state while the internal voltage is less than the reference voltage. A START-UP phase before entering the IDLE phase comprises ramping a supply voltage, activating an external Power On Reset (POR) while the supply voltage is less than a start-up threshold, the external POR holding the digital circuit in a reset state, activating a bandgap reference in response to the digital signal, wherein the digital signal is an active-low signal, activating an internal Power On Reset (POR) signal in response to the bandgap reference providing the reference voltage, the internal POR activating before deactivating the external POR, the internal POR holding the digital circuit in the reset state, and deactivating the internal POR in response to the internal voltage exceeding the reference voltage. A shifted voltage of the digital signal is shifted from the external voltage to the supply voltage. The digital circuit operates at a low data rate during the IDLE phase, and at a high data rate during the MEASUREMENT phase.

In another embodiment, a voltage regulator comprises a bandgap reference enabled by a first digital signal connected thereto, the bandgap reference configured to generate a reference voltage, and a bandgap status signal indicating that the reference voltage has stabilized. A feedback loop includes an amplifier enabled by the bandgap status signal connected thereto, and is configured to compare the reference voltage with a feedback voltage to generate a control voltage on a gate of an internal voltage transistor, the internal voltage transistor having a source follower configuration to generate an internal voltage on a source terminal of the internal voltage transistor, the feedback voltage generated by a resistive division of the internal voltage by a resistive divider connected between the source terminal of the internal voltage transistor and a fixed voltage reference. An external voltage transistor has the source follower configuration to generate an external voltage on a source terminal of the external voltage transistor. A gate of the external voltage transistor is connected to the gate of the internal voltage transistor. A pull-up circuit includes a pull-up comparator enabled by the bandgap status signal connected thereto, and is configured to compare a supply voltage with the control voltage increased by an offset voltage. The pull-up comparator is connected to a gate of an internal pull-up transistor. The internal pull-up transistor is connected in parallel with the internal voltage transistor. A Power On Reset (POR) circuit includes a POR comparator enabled by the bandgap status signal connected thereto, and is configured to compare the reference voltage with a scaled internal voltage to generate an internal POR signal. An external POR circuit is configured to generate an external POR signal while the supply voltage is less than a start-up threshold. The internal POR signal and the external POR signal are connected to an OR gate to generate a POR signal.

Alternative embodiments of the voltage regulator include one of the following features, or any combination thereof. The amplifier includes an input hysteresis formed by a gated connection between the amplifier and one of two taps of a resistive divider to generate the feedback voltage, one of the two taps selected in response to a high state of the pull-up comparator, and another of the two taps selected in response to a low state of the pull-up comparator. A sample-and-hold circuit includes a switch between the amplifier and the gate of the external voltage transistor to hold the control voltage on a storage capacitance of the external voltage transistor. A pull-up latch is connected between the pull-up comparator and a gate of an external pull-up transistor connected in parallel with the external voltage transistor. A POR latch is connected between the internal POR circuit and the OR gate. A digital circuit is connected to the source terminal of the external voltage transistor to receive power, the digital circuit connected to the POR signal configured to reset the digital circuit, the digital circuit generating the first digital signal and a second digital signal, the first digital signal connected to the bandgap reference, the second digital signal connected to a switch between the amplifier and the gate of the external voltage transistor, to a pull-up latch connected between the pull-up comparator and a gate of an external pull-up transistor, and to a POR latch connected between the internal POR circuit and the OR gate. The first digital signal is modified by a first level shifter, and the second digital signal is modified by a second level shifter, the first level shifter and the second level shifter connected to the POR signal to reset the respective level shifters.

In another embodiment, a method for voltage regulation comprises a START-UP phase comprising activating an external Power On Reset (POR), the external POR holding a digital circuit in a reset state, the digital circuit powered by the voltage regulator and the voltage regulator controlled by a first digital signal from the digital circuit, stabilizing a bandgap reference while the external POR is active, the bandgap reference providing a reference voltage, activating an internal POR after the bandgap reference is stable, the internal POR holding the digital circuit in the reset state, disabling the internal POR after stabilizing a feedback loop, the feedback loop providing an internal voltage regulated to the reference voltage, and an external voltage proportional to the internal voltage. An IDLE phase comprises storing an analog value determining the external voltage in response to a second digital signal from the digital circuit, storing a state of the internal POR in response to the second digital signal, disabling the feedback loop by disabling the bandgap reference, in response to the first digital signal. A MEASUREMENT phase comprises stabilizing the feedback loop by enabling the bandgap reference, in response to the first digital signal, disabling the internal POR after the feedback loop is stable, and restoring the analog value and restoring the state of the internal POR.

Alternative embodiments of the method for voltage regulation include one of the following features, or any combination thereof. The digital circuit is reset with the external POR in response to a supply voltage dropping below a start-up threshold, the supply voltage powering the external POR. The digital circuit operates at a low data rate during the IDLE phase, and at a high data rate during the MEASUREMENT phase, the low data rate and the high data rate stored in respective user-programmed registers.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for voltage regulation comprising:

reducing a power consumption of a voltage regulator during an IDLE phase, by disabling a feedback loop configured to regulate an internal voltage to a multiple of a reference voltage in response to the voltage regulator receiving a digital signal from a digital circuit, the internal voltage proportional to an external voltage supplied to the digital circuit; and increasing a regulated accuracy of the external voltage during a MEASUREMENT phase by enabling the feedback loop in response to the voltage regulator receiving the digital signal from the digital circuit, wherein the IDLE phase comprises:

storing a gate voltage on a gate of a transistor, the transistor supplying the external voltage to the digital circuit, the external voltage being less than a supply voltage, latching a first state of a pull-up transistor, the pull-up transistor changing the external voltage to the supply voltage in response to a difference between the supply voltage and the gate voltage being less than an offset voltage, latching a second state of an internal Power On Reset (POR) signal, the internal POR signal holding the digital circuit in a reset state while the internal voltage is less than the reference voltage, disabling a bandgap reference configured to provide the reference voltage, and disabling the feedback loop in response to disabling the bandgap reference.

2. The method of claim 1, further comprising disabling a pull-up comparator and a POR comparator in response to disabling the bandgap reference, the pull-up comparator comparing the supply voltage to the gate voltage increased by the offset voltage, and the POR comparator comparing the internal voltage to the reference voltage.

3. The method of claim 1 further comprising resetting the digital circuit with an external POR in response to the supply voltage dropping below a start-up threshold.

4. The method of claim 1 further comprising determining by the digital circuit, an IDLE duration of the IDLE phase and a MEASUREMENT duration of the MEASUREMENT phase, the voltage regulator entering the MEASUREMENT phase at the end of the IDLE duration, and the voltage regulator entering the IDLE phase at the end of the MEASUREMENT duration.

5. The method of claim 1 wherein the digital circuit operates at a low data rate during the IDLE phase, and at a high data rate during the MEASUREMENT phase.

6. A method for voltage regulation comprising:

reducing a power consumption of a voltage regulator during an IDLE phase, by disabling a feedback loop configured to regulate an internal voltage to a multiple of a reference voltage in response to the voltage regulator receiving a digital signal from a digital circuit, the internal voltage proportional to an external voltage supplied to the digital circuit; and increasing a regulated accuracy of the external voltage during a MEASUREMENT phase by enabling the feedback loop in response to the voltage regulator receiving the digital signal from the digital circuit, wherein the MEASUREMENT phase comprises:

enabling a bandgap reference configured to provide the reference voltage, stabilizing the feedback loop by ramping the internal voltage in response to enabling the bandgap reference, and disabling an internal Power On Reset (POR) signal in response to the internal voltage exceeding the reference voltage, and refreshing a gate voltage of a transistor supplying the external voltage to the digital circuit, by connecting a gate of the transistor to the feedback loop, after a time delay following the disabling of the internal POR signal, the time delay sufficient for the feedback loop to stabilize.

7. The method of claim 6, further comprising:

updating a first state of a pull-up transistor, the pull-up transistor changing the external voltage to the supply voltage in response to a difference between the supply voltage and the gate voltage being less than an offset voltage, and updating a second state of the internal POR signal, the internal POR signal holding the digital circuit in a reset state while the internal voltage is less than the reference voltage.

8. A method for voltage regulation comprising:

reducing a power consumption of a voltage regulator during an IDLE phase, by disabling a feedback loop configured to regulate an internal voltage to a multiple of a reference voltage in response to the voltage regulator receiving a digital signal from a digital circuit, the internal voltage proportional to an external voltage supplied to the digital circuit and increasing a regulated accuracy of the external voltage during a MEASUREMENT phase by enabling the feedback loop in response to the voltage regulator receiving the digital signal from the digital circuit, the method further comprising:

a START-UP phase before entering the IDLE phase, comprising:

ramping a supply voltage, activating an external Power On Reset (POR) while the supply voltage is less than a start-up threshold, the external POR holding the digital circuit in a reset state, activating a bandgap reference in response to the digital signal, wherein the digital signal is an active-low signal, activating an internal Power On Reset (POR) in response to the bandgap reference providing the reference voltage, the internal POR activating before deactivating the external POR, the internal POR holding the digital circuit in the reset state,; and deactivating the internal POR in response to the internal voltage exceeding the reference voltage.

9. The method of claim 8, further comprising shifting a shifted voltage of the digital signal from the external voltage to the supply voltage.

10. A voltage regulator, comprising:

a bandgap reference enabled by a first digital signal connected thereto, the bandgap reference configured to generate a reference voltage, and a bandgap status signal indicating that the reference voltage has stabilized;

a feedback loop including an amplifier enabled by the bandgap status signal connected thereto, and configured to compare the reference voltage with a feedback voltage to generate a control voltage on a gate of an internal voltage transistor, the internal voltage transistor having a source follower configuration to generate an internal voltage on a source terminal of the internal voltage transistor, the feedback voltage generated by a resistive division of the internal voltage by a resistive divider connected between the source terminal of the internal voltage transistor and a fixed voltage reference;

an external voltage transistor having the source follower configuration to generate an external voltage on a source terminal of the external voltage transistor, a gate of the external voltage transistor connected to the gate of the internal voltage transistor;

a pull-up circuit including a pull-up comparator enabled by the bandgap status signal connected thereto, and configured to compare a supply voltage with the control voltage increased by an offset voltage, the pull-up comparator connected to a gate of an internal pull-up transistor, the internal pull-up transistor connected in parallel with the internal voltage transistor; and a Power On Reset (POR) circuit including a POR comparator enabled by the bandgap status signal connected thereto, and configured to compare the reference voltage with a scaled internal voltage to generate an internal POR signal, an external POR circuit configured to generate an external POR signal while the supply voltage is less than a start-up threshold, the internal POR signal and the external POR signal connected to an OR gate to generate a POR signal.

11. The voltage regulator of claim 10, wherein the amplifier includes an input hysteresis formed by a gated connection between the amplifier and one of two taps of the resistive divider to generate the feedback voltage, one of the two taps selected in response to a high state of the pull-up comparator, and another of the two taps selected in response to a low state of the pull-up comparator.

12. The voltage regulator of claim 10 further comprising a sample-and-hold circuit including a switch between the amplifier and the gate of the external voltage transistor to hold the control voltage on a storage capacitance of the external voltage transistor.

13. The voltage regulator of claim 10 further comprising a pull-up latch connected between the pull-up comparator and a gate of an external pull-up transistor connected in parallel with the external voltage transistor.

14. The voltage regulator of claim 10 further comprising a POR latch connected between the internal POR circuit and the OR gate.

15. The voltage regulator of claim 10 further comprising a digital circuit connected to the source terminal of the external voltage transistor to receive power, the digital circuit connected to the POR signal configured to reset the digital circuit, the digital circuit generating the first digital signal and a second digital signal, the first digital signal connected to the bandgap reference, the second digital signal connected to a switch between the amplifier and the gate of the external voltage transistor, to a pull-up latch connected between the pull-up comparator and a gate of an external pull-up transistor, and to a POR latch connected between the internal POR circuit and the OR gate.

16. The voltage regulator of claim 15 wherein the first digital signal is modified by a first level shifter, and the second digital signal is modified by a second level shifter, the first level shifter and the second level shifter connected to the POR signal to reset the first and second level shifters.

17. A method for voltage regulation comprising:

a START-UP phase comprising, activating an external Power On Reset (POR), the external POR holding a digital circuit in a reset state, the digital circuit powered by the voltage regulator and the voltage regulator controlled by a first digital signal from the digital circuit, stabilizing a bandgap reference while the external POR is active, the bandgap reference providing a reference voltage, activating an internal POR after the bandgap reference is stable, the internal POR holding the digital circuit in the reset state, disabling the internal POR after stabilizing a feedback loop, the feedback loop providing an internal voltage regulated to the reference voltage, and an external voltage proportional to the internal voltage;

an IDLE phase comprising, storing an analog value determining the external voltage in response to a second digital signal from the digital circuit, storing a state of the internal POR in response to the second digital signal, disabling the feedback loop by disabling the bandgap reference, in response to the first digital signal; and a MEASUREMENT phase comprising, stabilizing the feedback loop by enabling the bandgap reference, in response to the first digital signal, disabling the internal POR after the feedback loop is stable, and restoring the analog value and restoring the state of the internal POR.

18. The method of claim 17 further comprising resetting the digital circuit with the external POR in response to a supply voltage dropping below a start-up threshold, the supply voltage powering the external POR.

19. The method of claim 17 wherein the digital circuit operates at a low data rate during the IDLE phase, and at a high data rate during the MEASUREMENT phase, the low data rate and the high data rate stored in respective user-programmed registers.

* * * * *